(12) United States Patent
Henderson et al.

(10) Patent No.: US 11,754,686 B2
(45) Date of Patent: Sep. 12, 2023

(54) DIGITAL PIXEL

(71) Applicants: The University Court of The University of Edinburgh, Edinburgh (GB); Sense Photonics, Inc., Durham, NC (US)

(72) Inventors: Robert Henderson, Edinburgh (GB); Hod Finkelstein, Berkeley, CA (US)

( * ) Notice: Subject to any disclaimer, the term of this patent is extended or adjusted under 35 U.S.C. 154(b) by 864 days.

(21) Appl. No.: 16/688,043

(22) Filed: Nov. 19, 2019

(65) Prior Publication Data

US 2020/0158836 A1 May 21, 2020

Related U.S. Application Data

(60) Provisional application No. 62/769,287, filed on Nov. 19, 2018.

(51) Int. Cl.
*G01S 7/4865* (2020.01)
*G01S 17/89* (2020.01)
(Continued)

(52) U.S. Cl.
CPC ............ *G01S 7/4865* (2013.01); *G01S 17/89* (2013.01); *G04F 10/005* (2013.01); *H01L 31/02027* (2013.01)

(58) Field of Classification Search
CPC ........ G01S 17/10; G01S 17/89; G01S 17/894; G01S 7/4863; G01S 7/4865; G04F 10/005; H01L 31/02027
(Continued)

(56) References Cited

U.S. PATENT DOCUMENTS

2015/0041625 A1 2/2015 Dutton et al.
2015/0293021 A1* 10/2015 Finkelstein ........ G01N 21/6454
506/13
(Continued)

FOREIGN PATENT DOCUMENTS

KR 1020090103268 A 10/2009
WO 2018/122560 A1 7/2018

OTHER PUBLICATIONS

Notification of Transmittal of the International Search Report and the Written Opinion of the International Searching Authority, or the Declaration, in corresponding PCT Application No. PCT/US2019/062099 (11 pages) (dated Mar. 9, 2020).

*Primary Examiner* — Kathleen M Walsh
(74) *Attorney, Agent, or Firm* — Myers Bigel, P.A.

(57) ABSTRACT

A Light Detection And Ranging (LIDAR) measurement circuit includes a processor circuit that is configured to receive detection signals output from a plurality of detector elements in response to a plurality of photons incident thereon during a detection window, identify detection events based on the detection signals, and calculating an estimated time of arrival of the plurality of photons based on a sum of respective numbers of the detection events that have been identified at respective time intervals of the detection window. The processor circuit may include at least one accumulator circuit that is configured to output the sum of the respective numbers of the detection events that have been identified at the respective time intervals based on a counter signal that is incremented responsive to each of the detection events, and a clock signal corresponding to the respective time intervals.

20 Claims, 8 Drawing Sheets

(51) Int. Cl.
*H01L 31/02* (2006.01)
*G04F 10/00* (2006.01)

(58) Field of Classification Search
USPC .......................................... 356/5.01
See application file for complete search history.

(56) References Cited

U.S. PATENT DOCUMENTS

| | | |
|---|---|---|
| 2016/0266054 A1 | 9/2016 | Cao et al. |
| 2017/0052065 A1* | 2/2017 | Sharma .................. G01S 17/18 |
| 2018/0088236 A1 | 3/2018 | Eichenholz et al. |
| 2018/0259645 A1* | 9/2018 | Shu ....................... G01S 7/4865 |
| 2018/0301589 A1 | 10/2018 | Burroughs et al. |
| 2018/0301872 A1 | 10/2018 | Burroughs et al. |
| 2019/0056497 A1* | 2/2019 | Pacala ................... G01S 7/4863 |
| 2019/0250257 A1 | 8/2019 | Finkelstein et al. |

* cited by examiner

DIGITAL PIXEL

CLAIM OF PRIORITY

This application claims the benefit of priority from U.S. Provisional Patent Application No. 62/769,287 entitled "Digital Pixel" filed on Nov. 19, 2018, in the United States Patent and Trademark Office, the disclosure of which is incorporated by reference herein.

FIELD

The subject matter herein relates generally to image sensors, and more specifically to image sensors for imaging in LIght Detection And Ranging (LIDAR) systems.

BACKGROUND

Time of flight (ToF) based imaging is used in a number of applications including range finding, depth profiling, and 3D imaging (e.g., LIDAR, also referred to herein as lidar). Direct time of flight measurement includes directly measuring the length of time between emitting radiation and sensing the radiation after reflection from an object or other target. From this, the distance to the target can be determined.

In some applications, the sensing of the reflected radiation may be performed using an array of photodetectors, including single-photon detectors, such as a Single Photon Avalanche Diode (SPAD) array. One or more photodetectors may define a detector pixel of the array. SPAD arrays may be used as solid-state photodetectors in imaging applications that may require high sensitivity and timing resolution. A SPAD is based on a semiconductor junction (e.g., a p-n junction) that may detect incident photons when biased beyond its breakdown region, for example, by or in response to a strobe signal having a desired pulse width. The high reverse bias voltage generates an electric field of sufficient magnitude such that a single charge carrier introduced into the depletion layer of the device can cause a self-sustaining avalanche via impact ionization. The avalanche may be quenched by a quench circuit, either actively (e.g., by reducing the bias voltage) or passively (e.g., by using the voltage drop across a serially connected resistor), to allow the device to be "reset" to detect further photons. The initiating charge carrier can be photo-electrically generated by means of a single incident photon striking the high field region. It is this feature which gives rise to the name 'Single Photon Avalanche Diode'. This single photon detection mode of operation is often referred to as 'Geiger mode'.

To count photons that are incident on array of SPADs, some ToF pixel approaches may use either a digital counter or an analog counter to indicate the detection and arrival times of photons, also referred to as time-stamping. Digital counters may be easier to implement and scale, but may be more expensive in terms of area (e.g., with respect to the physical size of the array). Analog counters may be more compact, but may suffer from limited photon counting depth (bit depth), noise, and/or uniformity issues.

To time-stamp incident photons, some SPAD array-based ToF pixel approaches have used a Time-to-Digital Converter (TDC). TDCs can be used in time of flight imaging applications to increase timing resolution over that of a single clock cycle. Some advantages of such digital approaches may include that the size of the TDC tends to scale with technology node, and the stored value can be more robust to leakage.

However, TDC circuits may only be able to process one event in a single measurement cycle, such that multiple TDCs may be required for an array of SPADs. TDCs may also be relatively power consuming, making larger arrays more difficult to implement. TDCs may also generate relatively large amounts of data, e.g., one 16-bit timestamp per photon. A single SPAD connected to a TDC may generate millions of such timestamps per second. An imaging array of greater than 100,000 pixels therefore can generate unfeasibly large data rates relative to the available input/output bandwidth or capability.

Data rates can be compressed by histogramming timestamps; however, this can involve considerable memory resources which may be inefficiently used in typical ToF LIDAR systems. For example, the memory depth of the histogram bins (which may indicate respective subranges of photon arrival times) is typically set by the maximum laser returns in the peak, whereas, in practice, many or most histogram bins will be sparsely occupied (e.g., only by background noise). In addition, thousands of time bins may typically be used to form a histogram sufficient to cover the typical time range of a LIDAR system (e.g., microseconds) with the typical TDC resolution (e.g., 50-100 ps).

SUMMARY

According to some embodiments of the present invention, a Light Detection And Ranging (LIDAR) measurement circuit includes at least one processor circuit. The at least one processor circuit is configured to perform operations including receiving detection signals output from a plurality of detector elements in response to a plurality of photons incident thereon during a detection window, identifying detection events based on the detection signals, and calculating an estimated time of arrival of the plurality of photons. The estimated time of arrival of the plurality of photons is calculated based on a sum or integration of respective numbers of the detection events that have been identified at respective time intervals of the detection window.

In some embodiments, the at least one processor circuit may include an accumulator circuit. The accumulator circuit may be configured to output the sum of the respective numbers of the detection events that have been identified at the respective time intervals based on a counter signal that is incremented responsive to each of the detection events, and based on a clock signal corresponding to the respective time intervals. For example, the accumulator circuit may define a time integration circuit configured to integrate a respective number of the detection events at each of the time intervals over the detection window responsive to respective pulses of the clock signal at the respective time intervals.

In some embodiments, the accumulator circuit may be a first accumulator circuit, and the at least one processor circuit may include a second accumulator circuit. The second accumulator circuit may be configured to output a count value indicating a total number of the detection events that have been identified during the detection window, based on the counter signal. For example, the second accumulator circuit may define a photon counter circuit configured to sum the total number of the detection events identified based on the detection signals.

In some embodiments, the at least one processor circuit may include a correlation circuit. The correlation circuit may be configured to identify each of the detection events based on respective subsets of the detection signals output within respective correlation times relative to one another, which may be referred to as correlated detection signals. The correlation circuit may be configured to increment the counter signal responsive to the identifying of each of the detection events.

In some embodiments, the at least one processor circuit may include a parallel counter circuit. The parallel counter circuit may be configured to output a signal indicating a number of the detection signals of each of the respective subsets. The correlation circuit may be configured to perform the identifying of the detection events based on the number of the detection signals of each of the respective subsets relative to a threshold number.

In some embodiments, the accumulator circuit may be configured to integrate respective values of the counter signal responsive to respective pulses of the clock signal. A period of the respective pulses of the clock signal may correspond to the respective time intervals.

In some embodiments, the at least one processor circuit may include a clock circuit. The clock circuit may be configured to output the clock signal to the accumulator circuit responsive to a strobe signal corresponding to the detection window and one of the detection events indicated by the identifying, and independent of a start of the detection window.

In some embodiments, the at least one processor circuit may be configured to calculate the estimated time of arrival of the plurality of photons based on a ratio of the sum of the respective numbers of the detection events that have been identified at the respective time intervals of the detection window and a count value indicating a total number of the detection events that have been identified during the detection window.

In some embodiments, the detection window may be a first detection window, and the operations may further include receiving second detection signals output from one or more of the plurality of detector elements responsive to second photons incident thereon during a second detection window. The at least one processor circuit may be configured to perform background correction of the estimated time of arrival based on the second detection signals.

In some embodiments, the detection signals may indicate respective times of arrival of the photons during the detection window, and the at least one processor circuit may be configured to calculate the estimated time of arrival of the plurality of photons independent of time to digital conversions of the respective times of arrival.

According to some embodiments of the present invention, a Light Detection And Ranging (LIDAR) system includes a detector array and at least one processor circuit. The detector array includes single-photon detector elements that are configured to output detection signals in response to a plurality of photons incident thereon during a detection window. The at least one processor circuit is configured to receive the detection signals output from the detector array, identify detection events based on the detection signals, and calculate an estimated time of arrival of the plurality of photons based on a sum of respective numbers of the detection events that have been identified at respective time intervals of the detection window.

In some embodiments, the at least one processor circuit may include a first accumulator circuit and a second accumulator circuit. Responsive to respective pulses of a clock signal corresponding to the respective time intervals, the first accumulator circuit may be configured to output the sum of the respective numbers of the detection events that have been identified at the respective time intervals by integrating respective values of a counter signal that is incremented responsive to each of the detection events. The second accumulator circuit may be configured to output a count value indicating a total number of the detection events that have been identified during the detection window, based on one of the respective values of the counter signal. The at least one processor circuit may be configured to calculate the estimated time of arrival of the plurality of photons based on a ratio of the sum and the count value.

In some embodiments, the at least one processor circuit may further include a correlation circuit and a clock circuit. The correlation circuit may be configured to identify the detection events based on respective subsets of the detection signals output within respective correlation times relative to one another, and may be configured to increment the counter signal responsive to each of the detection events. The clock circuit may be configured to output the clock signal responsive to one of the detection events identified by the correlation circuit and a strobe signal corresponding to the detection window.

In some embodiments, the at least one processor circuit may further include a parallel counter circuit. The parallel counter circuit may be configured to output a signal indicating a number of the detection signals of each of the respective subsets. The correlation circuit may be configured to identify the detection events based on the number of the detection signals of each of the respective subsets relative to a threshold number.

In some embodiments, the detection signals may indicate respective times of arrival of the photons during the detection window. The at least one processor circuit may be configured to calculate the estimated time of arrival of the plurality of photons independent of time to digital conversions of the respective times of arrival.

According to some embodiments of the present invention, a Light Detection And Ranging (LIDAR) measurement circuit includes at least one processor circuit that is configured to receive detection signals output from single-photon detector elements indicating respective times of arrival of photons incident thereon during a detection window. The at least one processor circuit includes one or more accumulator circuits that are configured to sum respective numbers of detection events that have been identified at respective time intervals of the detection window based on the detection signals to calculate an estimated time of arrival of the photons independent of time to digital conversions of the respective times of arrival.

In some embodiments, the one or more accumulator circuits may include a first accumulator circuit and a second accumulator circuit. The first accumulator circuit may be configured to output the sum by integrating respective values of a counter signal that is incremented responsive to each of the detection events, responsive to respective pulses of a clock signal corresponding to the respective time intervals.

In some embodiments, the one or more accumulator circuits may further include a second accumulator circuit. The second accumulator circuit may be configured to output a count value indicating a total number of the detection events that have been identified during the detection window, based on one of the respective values of the counter signal. The at least one processor circuit may be configured to calculate the estimated time of arrival of the plurality of photons based on a ratio of the sum and the count value.

In some embodiments, the at least one processor circuit may further include a correlation circuit and a clock circuit. The correlation circuit may be configured to identify the detection events based on respective subsets of the detection signals output within respective correlation times relative to one another, and may be configured to increment the counter signal responsive to each of the detection events. The clock circuit may be configured to output the clock signal responsive to one of the detection events identified by the correlation circuit and a strobe signal corresponding to the detection window.

In some embodiments, the at least one processor circuit may further include a parallel counter circuit. The parallel counter circuit may be configured to output a signal indicating a number of the detection signals of each of the respective subsets. The correlation circuit may be configured to identify the detection events based on the number of the detection signals of each of the respective subsets relative to a threshold number.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

Some embodiments of the present invention are directed to arrays of optical detector elements (e.g., single-photon detectors, such as SPADs) that use digital signal processing for Center-of-Mass Method (CMM)-based direct ToF calculations, also referred to herein as "digital pixels" or "CMM pixels." CMM pixels as described herein may be configured to calculate the center-of-mass representing the distribution of the times-of-arrival (TOAs) of signal photons, in some embodiments over a correlation time or window relative to one another, which can be used to estimate the time of flight to (and thus, distance of) a target. CMM pixels as described herein may be configured to count incident photons without the use of a TDC (that is, without performing time to digital conversions of the respective TOAs), and can integrate many time stamps at the pixel level or "in-pixel"(e.g., with each pixel providing outputs to dedicated circuits, such as correlator, counter, and/or time integrator logic, which are not shared with other pixels) in a manner that may be less computationally intensive and/or power hungry than some conventional approaches.

Figure 1A:
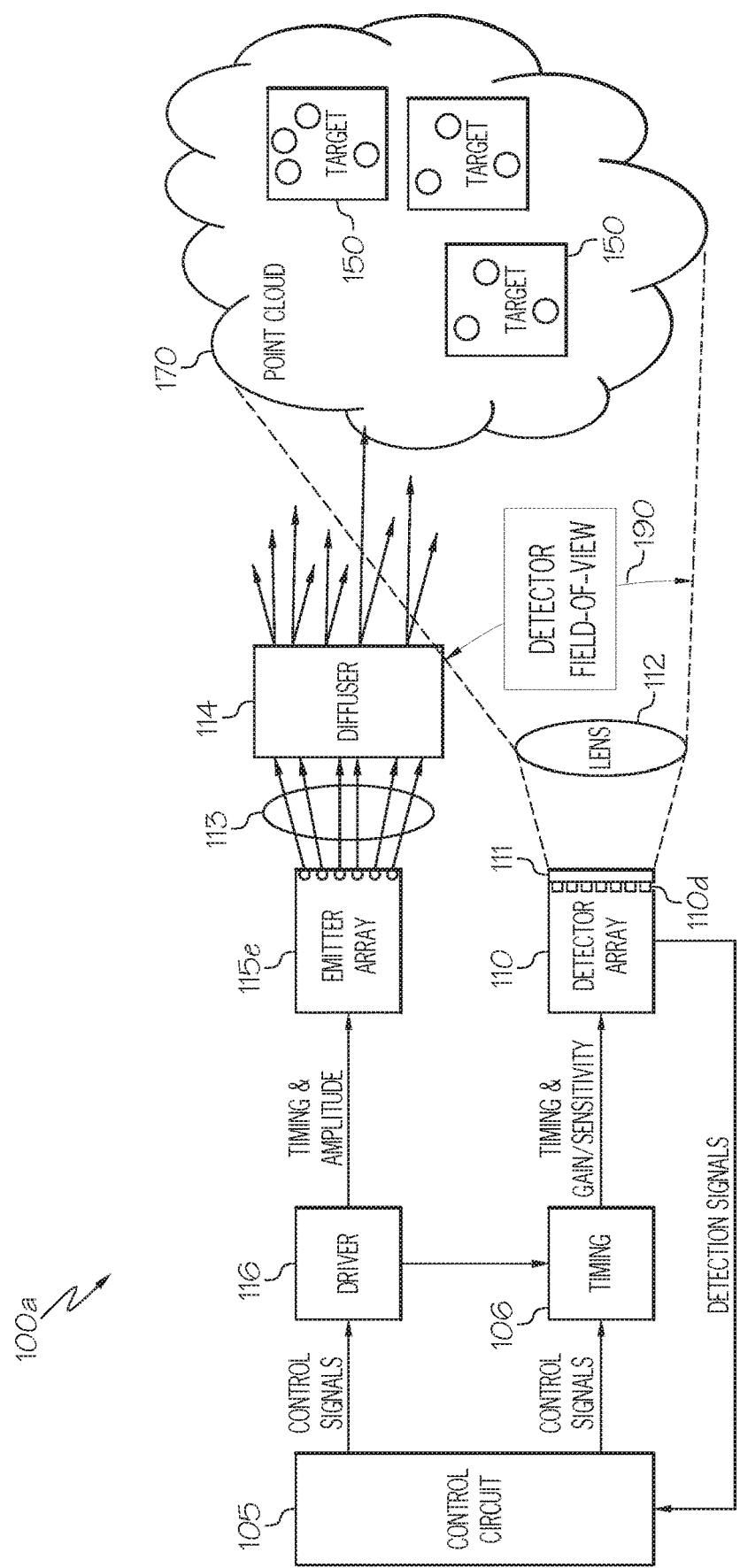
FIGS. 1A and 1B illustrate example ToF measurement systems and related components in lidar applications in accordance with some embodiments of the present invention.
Figure 1B:
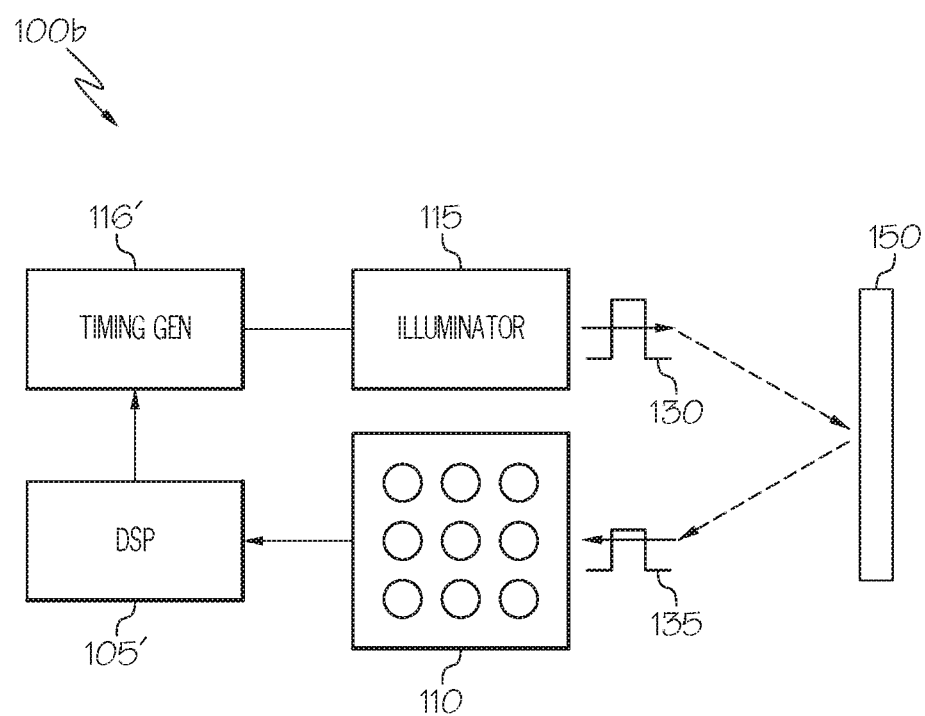

FIGS. 1A and 1B illustrate example ToF measurement systems 100a and 100b and related components in LIDAR applications in accordance with some embodiments of the present invention. As shown in FIG. 1A, the system 100a includes a control circuit 105, a timing circuit 106, the illumination source (illustrated as an emitter array 115 including a plurality of emitter elements or emitters 115e), and a detector array 110 including a plurality of detector elements or detectors 110d. Each detector 110d may represent a photodetector (e.g., a photodiode), and one or more detectors 110d may define a respective detector pixel of the detector array 110. One or more emitters 115e of the emitter array 115 may define emitter units that respectively emit a radiation pulse or continuous wave signal (for example, through a diffuser or optical filter 114) at a time and repetition rate controlled by a timing generator or driver circuit 116. In particular embodiments, the emitters 115e may be pulsed light sources, such as LEDs or lasers (such as vertical cavity surface emitting lasers (VCSELs) and/or edge-emitting lasers).

In some embodiments, an emitter module or circuit may include the array 115 of emitter elements 115e, a corresponding array of optical elements 113, 114 coupled to one or more of the emitter elements (e.g., lens(es) 113 (such as microlenses) and/or diffusers 114), and the driver circuit 116. In some embodiments, each of the emitter elements 115e in the emitter array 115 is connected to and controlled by a respective driver circuit 116. In other embodiments, respective groups of emitter elements 115e in the emitter array 115 (e.g., emitter elements 115e in spatial proximity to each other), may be connected to a same driver circuit 116. The driver circuit 116 may include one or more driver transistors configured to control the pulse repetition rate, timing and amplitude of the optical emission signals that are output from the emitters 115e.

In some embodiments, a detector module or circuit includes the array 110 of detectors 110d, receiver optics 112 (e.g., one or more lenses to collect light over the FoV 190 of the array 110), and receiver electronics (including timing circuit 106) that are configured to power, enable, and disable all or parts of the detector array 110 and to provide timing signals thereto. The receiver optics 112 may include a macro lens that is configured to collect light from the largest FoV that can be imaged by the lidar system, a spectral filter 111 to pass or allow passage of a sufficiently high portion of the 'signal' light (i.e., light of wavelengths corresponding to those of the optical signals output from the emitters) but substantially reject or prevent passage of non-signal or 'background' light (i.e., light of wavelengths different than the optical signals output from the emitters), microlenses to improve the collection efficiency of the detector pixels, and/or anti-reflective coating to reduce or prevent detection of stray light. The detector array 110 includes time-of-flight sensors (for example, an array of single-photon detectors, such as Geiger-mode avalanche diodes (e.g., SPADs).

The timing circuit 106 may control the timing and gain/sensitivity of the detector array 110. The timing circuit 106 for the detector array 110 may be phase-locked to the driver circuit 116 of the emitter array 115 in some embodiments. The timing circuit 106 may also control the sensitivity of each of the detectors 110d, of groups of detectors 110d defining etector pixel. For example, when a detector pixel includes one or more reverse-biased Geiger-mode photodiodes (e.g., SPADs) $110d$, the reverse bias applied to each photodiode $110d$ of the detector pixel may be adjusted (e.g., based on a voltage differential of the electrodes 107 described herein), whereby, the higher the overbias, the higher the sensitivity. The detectors $110d$ can be activated or deactivated with at least nanosecond precision, and may be individually addressable, addressable by group, and/or globally addressable.

As shown in FIG. 1A, light emission output from one or more of the emitters $115e$ of the emitter array 115 impinges on and is reflected by one or more targets 150, and the reflected light is detected as an echo signal by one or more of the detectors $110d$ of the detector array 110, converted into electrical signal representations (referred to herein as a detection signals), and processed (e.g., based on time of flight) to define a 3-D point cloud representation 170 of the scene within the field of view 190. Operations of LIDAR systems in accordance with embodiments of the present invention as described herein may be performed by one or more processors or controllers, such as the control circuit 105 of FIG. 1A or the digital signal processor (DSP) 105' of FIG. 1B.

FIG. 1B further illustrates components of a ToF measurement system or circuit $100b$ in a LIDAR application in accordance with some embodiments described herein. The circuit $100b$ may include a processor circuit (illustrated as DSP 105'), a timing generator 116' which controls timing of the illumination source (illustrated by way of example with reference to a laser emitter array 115), and an array of single-photon detectors (illustrated by way of example with reference to a single-photon detector array 110). The DSP 105' and the timing generator 116' may implement some of the operations of the control circuit 105 and the driver circuit 116 of FIG. 1A. The laser emitter array 115 emits a laser pulse 130 at a time controlled by the timing generator 116'. Light 135 from the laser pulse 130 is reflected back from a target (illustrated by way of example as object 150), and is sensed by single-photon detector array 110. The DSP 105' implements a CMM pixel processor that measures the ToF of the laser pulse 130 and its reflected signal 135 over the journey from emitter array 115 to object 150 and back to the single-photon detector array 110.

The DSP 105' may include logic circuits that provide the necessary timing signals (such as quenching and gating or strobe signals) to control operation of the single-photon detectors of the array 110 and process the detection signals output therefrom. For example, the single-photon detectors of the array 110 may generate detection signals in response to incident photons only during short gating intervals or strobe windows that are defined by the strobe signals. Photons that are incident outside the strobe windows have no effect on the outputs of the single photon detectors.

The CMM pixel processor implemented by the DSP 105' is configured to calculate an estimate of the average ToF aggregated over thousands of laser pulses 130 and photon returns in reflected light 135. The DSP 105' may be configured to count incident photons in the reflected light 135 by implementing one or more accumulator circuits in accordance with embodiments described herein, also referred to herein as accumulators. The accumulator(s) may be configured to sum inputs received from the single-photon detector array 110 responsive to incident photons on the single-photon detector array 110. For example, the accumulator(s) may be configured to calculate a "rolling" center of mass (CM) of the incident photons detected over a laser cycle of the laser pulse 130, based on how many/the number of detection events that have been identified (e.g., the number of SPADs 110 that have been triggered) over a laser cycle (or portion thereof, referred to herein as a detection window), rather than based on when/the times of the detection events (e.g., the times at which the SPADs $110d$ were triggered) over the laser cycle or detection window (which may require time-to-digital conversion). The timings and durations of the detection windows may be controlled by a strobe signal (Strobe<i>) as described herein, and thus, may also be referred to as strobe windows. Embodiments of the present invention may thus estimate ToF without performing time-to-digital conversion operations, e.g., without the use of a TDC.

The DSP 105' may provide digital implementations of the logic circuits described herein, which may offer advantages over analog implementations. In particular, analog implementations may be limited by characteristics of physical components (e.g., capacitors, resistors) that may impose difficulties with respect to size and/or temperature dependence in semiconductor processes. For example, temperature-dependent components, such as resistors, may impose limitations with respect to calibration and compensation for Process Voltage and Temperature (PVT) dependencies. Analog implementations may also face issues such as leakage of stored charge in capacitors and/or electrical cross-talk. Digital implementations such as the DSP 105' may operate independent of these and/or other limitations that may be faced by analog implementations. The DSP 105' (or other digital implementation) may also be small enough to allow for three-dimensionally stacked implementations, with the array 110 "stacked" on top of the DSP 105' (and other related circuits) that is sized to fit within an area or footprint of the array 110.

Figure 2:
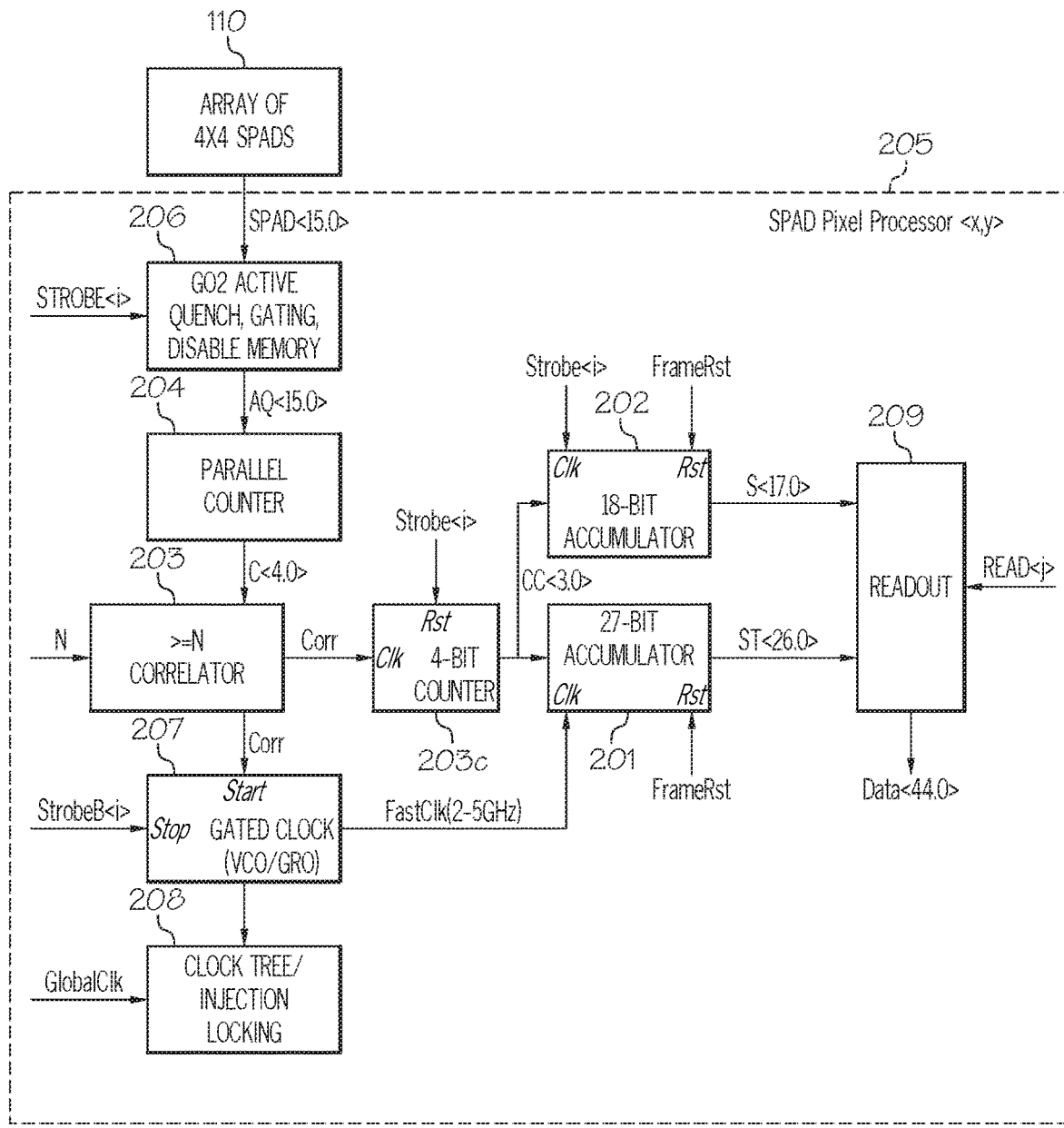
FIG. 2 illustrates an example CMM pixel processor in accordance with some embodiments of the present invention.
Figure 3:
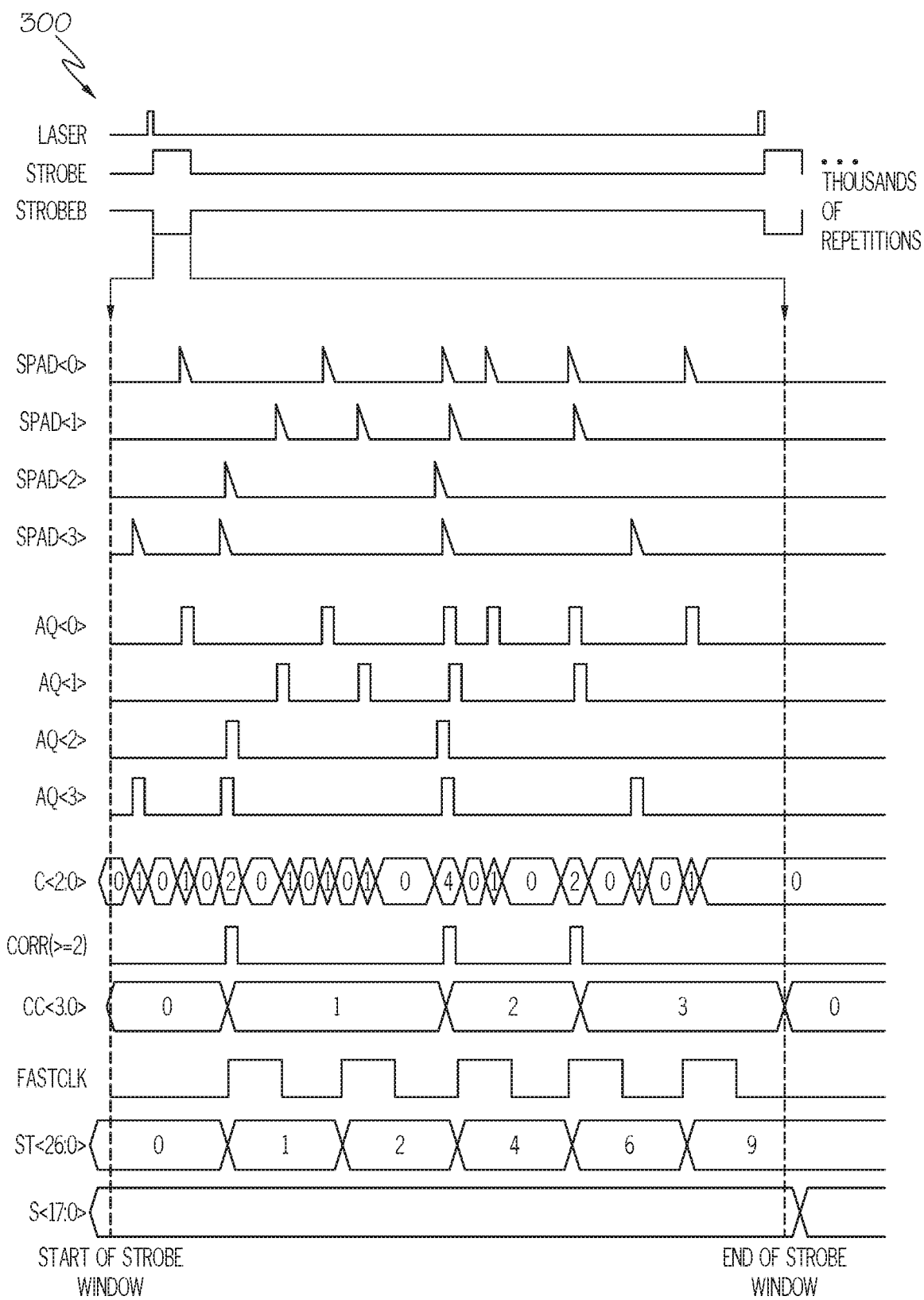
FIG. 3 is a timing diagram illustrating operations of components of the CMM pixel processor of FIG. 2.

FIG. 2 illustrates an example CMM pixel processor circuit (which may be implemented by the DSP 105') in accordance with some embodiments of the present invention. The CMM pixel processor is illustrated as a SPAD pixel processor 205 that receives inputs from 16 SPADs implemented in a 4×4 SPAD array 110, but smaller or larger or other detector arrays (e.g., arrays of other single photon detectors) may be used. FIG. 3 is a timing diagram illustrating operations of the components of the CMM pixel processor 205 of FIG. 2. FIG. 4 is a diagram illustrating relationships between image frames, subframes, laser cycles, and time gates (also referred to herein as strobe windows or detection windows) that may be used in some lidar systems. The time gates/strobe windows define durations of time (corresponding to respective portions of the time between laser pulses in a laser cycle) during which one or more SPADs of the array 110 are active or enabled to detect incident photons. The strobe windows or detection windows may thus define respective measurement intervals, which may be further divided into respective time intervals or timesteps k as described herein. Numerical values are described by way of example rather than limitation.

As shown in FIG. 2, some embodiments described herein may include accumulator-based center of mass calculation, without performing time-to-digital conversion operations (and the associated computational overhead and power consumption), with detection windows or strobe windows (defined by strobe signals Strobe<i>) corresponding to "time slices" of a time duration (e.g., corresponding to respective portions the laser cycle or period of time between laser pulses), where i refers to the $i^{th}$ strobe window in a laser cycle in which the strobe windows are ordered. For example, in some embodiments, the strobe windows may be ordered sequentially with increasing time (e.g., with each sequential strobe window representing a subsequent duration of the time between laser pulses). However, it will be understood that the strobe windows need not be in time-sequential order; that is, the strobe window corresponding to the initial portion of the time between laser pulses need not be the first strobe window in the sequence of strobe windows.

Many repetitions of Strobe<i> are aggregated (e.g., in the pixel) to define a sub-frame for Strobe<i>, with subframes 1 to i defining an image frame. Each sub-frame for Strobe<i> may correspond to a respective distance sub-range of the overall imaging distance range, which is defined by the frequency of the laser cycle. The strobe windows may be referred to below with reference to timesteps k, where k denotes the $k^{th}$ time interval in a strobe/detection window which is sampled by a clock (referred to in some examples herein with reference to clock signal FastClk). The clock may have a period of some factor (e.g., 10 times or 20 times shorter than the in some examples described herein) shorter than the strobe window time duration.

Referring to FIG. 2, the accumulator circuits 201, 202 (also referred to herein as accumulators) may be registers of a processor or control circuit 205 that are operable to accumulate and integrate detection events (e.g., single-photon detection events, in some embodiments correlated within a time window) indicated by the detection signal(s) output from a single-photon detector array 110 (described with reference to a SPAD array) in response to detection of incident photons during or over a detection window. The example of FIG. 2 includes first and second accumulators 201 and 202, where the first accumulator 201 functions as a time or temporal accumulator or time integrator that is configured to track detection of photons incident upon the detector array 110 at respective times over the strobe window, and the second accumulator 202 functions as a photon counter to collect a photon count corresponding to a total number of photons that were detected during the strobe window. More particularly, the first accumulator 201 is configured to integrate the number of detection events that have been identified as of respective time intervals or time bins (i.e., the timesteps k) of the detection window as a representation of the respective times of arrivals of the detected photons, and the second accumulator 202 functions as a photon counter that is configured to count the total number detection events that were identified over the detection window.

The first and second accumulator circuits 201 and 202 provide respective memory arrays (e.g., per detector pixel), where a first memory array effectively stores a histogram of the accumulated product of the respective time bin or timestep k and number of detection events (e.g., the number of SPADs that output signals (or are 'fired') in response to incident photons ($\Sigma_{k=0}^{NP} NS(k)$)), and a second memory array stores the accumulated number of counts of the detection events. A ratio of the integrated number of detection events per time interval and the number of counts per detection window (i.e., the average number of detection events per time interval) is used to calculate the center of mass. In strobing configurations as described herein, the histogram may only be collected from the start until the end of a strobe window (e.g., a subframe-variable-strobe), in contrast to some conventional configurations where the data collection may always start a pre-set time after the laser fires and may always end a pre-set time afterward. While primarily described herein with reference to strobing configurations, embodiments described herein may likewise be applied in a single-strobe per laser cycles (i.e. where the time between laser pulses defines a single strobe window) configuration as well, in some embodiments with data collection initiated by an initial detection event (and thus delayed relative to the start of the strobe window).

Detection events may be identified by the processor circuit 205 based on one or more detection signals output from the detector array 110. In some embodiments, the accumulator(s) 201, 202 may be operable responsive to the output of a correlator 203. The correlator 203 provides output signals identifying detection events in response to detection signals output from two or more detectors within a predefined window of time relative to one another, referred to herein as a correlation window or correlation time, where the detection signals indicate arrival times of incident photons within the correlation window. As photons corresponding to the optical signals output from the emitter array 115 (also referred to as signal photons) may arrive relatively close in time as compared to photons corresponding to ambient light (also referred to as background photons), the correlator 203 is configured to distinguish signal photons based on respective times of arrival within the correlation time relative to one another. Such correlators are described, for example, in U.S. Patent Application Publication No. 2019/0250257 entitled "Methods and Systems for High-Resolution Long Range Flash Lidar," which is incorporated by reference herein. That is, in some embodiments, in-pixel correlation as described herein may involve calculation of the center of mass of the distribution of detection events that satisfy the correlation window defined by the correlator, using rolling CMM estimation methods as described in greater detail below.

In addition, the processor circuit 205 may be configured to perform background correction operations, such as background subtraction calculation. Such background correction calculations can correct the intensities of light indicated by the detection events by taking into account background photons, e.g., from sunlight or other ambient light conditions, which may otherwise push the center of mass towards the center of the strobe window. In some embodiments, a background-corrected TOA ($TOA_{bg\_corrected}$) can be calculated using rolling CMM estimation methods as described herein:

$$TOA_{bg\_corrected} = \frac{(TOA_{meas} \times n_{bg+sig}) - (t_{win,mid} \times n_{bg})}{n_{sig}} = \frac{\sum_{k=1}^{m}(t_{sig,k} \times n_k)}{n_{sig}}$$

where $TOA_{meas}$ is the estimated time of arrival of a plurality of photons based on the ratio of the sum of the respective numbers of the detection events that have been identified at the respective time intervals of the detection window and a count value indicating a total number of the detection events that have been identified during the detection window; $n_{bg+sig}$ is the count value at the end of each detection window; $t_{win,mid}$ is the known time of the middle of the time band of the current detection window; $n_{bg}$ is the background photon count value during a passive detection window or an extrapolated count number based on another passive detection window; and $n_{sig}=n_{bg+sig}-n_{bg}$ is the calculated difference between the count value during each detection window and the count value of the last passive detection window counter for the same pixel, which value may be stored in memory or in a memory array (for a number of sub-frames) and replaced each time the same detection window's passive output is acquired. The background photon counts $n_{bg}$ or intensity level may be estimated, for example, by detecting a frame that is free of laser illumination, or, alternatively, detecting a sub-frame where there is no return or echo signals, either of which may provide the passive detection window discussed above. Background correction may utilize this background information to apply the correction in calculating the center of mass, and may be performed on-chip, in an external FPGA or ASIC, and/or in software executed thereby. Such operations for background subtraction are described in greater detail, for example, in U.S. Patent Application Publication No. 2019/0250257.

The processor circuit 205 also includes circuits 206 that are configured to perform quench and recharge operations. If a burst of multiple photons arrive substantially concurrently at a SPAD, it has the same effect as a single photon, namely, to discharge the SPAD. Once the SPAD has been discharged by the leading photon, it is blind to all the other photons in the burst (shown as "dead time" in FIG. 4A) until quenched and recharged by quench and recharge circuits 206. In some embodiments, the quench and recharge circuits 206 are configured to recharge the SPADs 110 before the beginning of a strobe window because, other than in the first strobe window, the laser would have already fired. Recharging before the detection window (and the collection of photons) can ensure that the SPADs are fully charged throughout the strobe window and the detection probability is relatively constant. Active and/or passive quenching and/or recharge circuits for each single photon detector are also described, for example, in U.S. Patent Application Publication No. 2019/0250257.

In some embodiments, the accumulator(s) 201, 202 may be operable responsive to output from a parallel counter 204, the correlator 203 and correlation counter 203c, and/or a gated clock 207. The parallel counter 204 is configured to provide output signal C<4:0> that indicates detection of photons at multiple SPADs of the array, even under simultaneous detection conditions. The correlator 203 is configured to generate output signal Corr identifying a detection event only responsive to detection of two or more "correlated" photons that arrive within a predetermined or adjustable correlation window. The correlation counter 203c is configured to increment and output a counter signal CC<3:0> in response to each detection event. The gated clock 207 is configured to be controlled based on signal StrobeB<i> to provide clock source signal FastClk to the time accumulator 202. The clock source signal FastClk provides sampling of the counter signal CC<3:0> at a frequency corresponding to the number of timesteps k.

Operations of some components of the SPAD pixel processor 205 of FIG. 2 will now be described with reference to the timing diagram 300 of FIG. 3. A time measurement indicating time of arrival as described herein may be commenced by emission of an illumination pulse (illustrated with reference to pulses of a laser Laser) and ended by a detection signal output from a SPAD in response to detection incident photons (one or more of which may be referred to herein as detection events), such that the time measured is the time of flight of the illumination pulse.

In the example of FIG. 3, the SPADs are enabled by timing or gating circuits during a strobe window at the beginning of a laser cycle (that is, at a first strobe window of signal Strobe<i> immediately after the first pulse of Laser shown in FIG. 3); however, it will be understood that similar operations may be performed for other strobe windows corresponding to different portions of the laser cycle. The illustrated strobe window of signal Strobe<i> may be repeated (e.g., for thousands of cycles of the signal Laser) before moving to the next strobe window (e.g., Strobe<i+1>). That is, each strobe window represented by Strobe<i> represents a portion of the time between laser pulses or the signal Laser, and thousands of cycles of the signal Laser may be allocated to each strobe window of signal Strobe<i> (where the laser cycle may be divided into n portions, and i=1 to n). Circuit 206 in FIG. 2 is illustrated as implementing the timing or gating circuits, active quench circuits, and active recharge circuits.

Referring to FIG. 3, the timing diagram 300 shows example detection signals SPAD<3:0> that are output responsive to detection of respective photons by four SPADs (of the 16 SPADs in the array 110 of FIG. 2). The four output signals AQ<3:0> of the SPAD active quench, active recharge circuit 206 include pulses of a controlled duration based on the correlation time or window (e.g., determined by the correlator 203, where the duration may be adjustable by external voltage control). The parallel counter 204 sums the AQ <3:0> signals asynchronously as output signals C<2:0>, reaching maximum values (of 2 or 4 in this example) when several SPADs 110 output detection signal pulses substantially simultaneously or otherwise within the correlation window.

The correlator 203 outputs correlation signal Corr when the output C<2:0> of the parallel counter 204 equals or exceeds a threshold of 2, that is, when multiple SPADs detect photons within the correlation window, to indicate a detection event. Each pulse of the correlation signal Corr thus represents identification of a respective detection event. The initial pulse of pulse signal Corr enables the gated clock 207 to output clock source signal FastClk (e.g., at a delay relative to the start of the strobe window). The clock signal FastClk is output until the end of the strobe window (e.g., stopped in response to the signal StrobeB<i>, illustrated as the inverse of strobe signal Strobe<i>) and provides a clock signal for the time accumulator 201. The frequency or period of pulses of the clock signal FastClk may correspond to the number of time intervals k in a respective strobe or detection window (e.g., the period of FastClk may equal the time duration of the strobe window divided by the number of time intervals k, with the frequency of FastClk being the reciprocal of the period), but the clock signal FastClk is enabled independent of the start time of the strobe or detection window.

A correlation counter 203c (illustrated by way of example as a 4-bit counter) also operates responsive to the pulses of pulse signal Corr and outputs counter signals CC<3:0> to the accumulators 201, 202. The counter signal CC<3:0> provides a running total of the detection signals that are correlated in time (also referred to herein as correlated detection events) during the strobe window. In particular, the correlation counter 203c is configured to increment and output the counter signal CC<3:0> in response to each detection event indicated by the output Corr of the correlator 203 to indicate the number of correlated detection events that have been identified during the strobe window of signal Strobe<i>. The correlation counter 203c and the correlator 203 may be collectively referred to herein as a correlation circuit.

The time accumulator 201 (illustrated by way of example as a 27-bit accumulator) performs rolling CMM estimation as described herein by integrating respective values of the counter signal CC<3:0> output from the correlation counter 203c responsive to respective pulses of the clock signal FastClk, to generate output signal ST<26:0> to readout circuit 209. As each clock pulse of the clock signal FastClk corresponds to a respective time interval of the detection window, the output signal ST<26:0> from the time accumulator 201 thus represents the sum of the respective number of correlated detection events that were identified at the respective time intervals of the detection window.

At the end of the strobe window, the total number of correlated detection events CC<3:0> is also summed by the photon counter 202 (illustrated by way of example as a 18-bit accumulator), which output signal S<17:0> to the readout circuit 209. The signal S<17:0> provides a count value indicating the total number of correlated detection events that were identified by the end of the detection window. The readout circuit 209 outputs a data signal Data <44:0> (e.g., at the end of each subframe). As discussed below with reference to FIGS. 4A and 4B, a subframe may include data collected for a respective strobe window Strobe<i> that is repeated for multiple (e.g., thousands of) laser cycles). The accumulators 201 and/or 202 may be reset by signal FrameRst at the end of a subframe. The processor circuit 205 is configured to calculate the center of mass based on the data signal Data <44:0> output from the readout circuit, in particular, based on a ratio of the sum that is output from the time accumulator 201 and the count value output from the photon counter 202, offset by the total number of time intervals in the detection window. The numerical values discussed herein (e.g., bit values, number of signal outputs, etc.) are provided by way of example only and are in no way limiting to embodiments described herein.

Figure 4A:
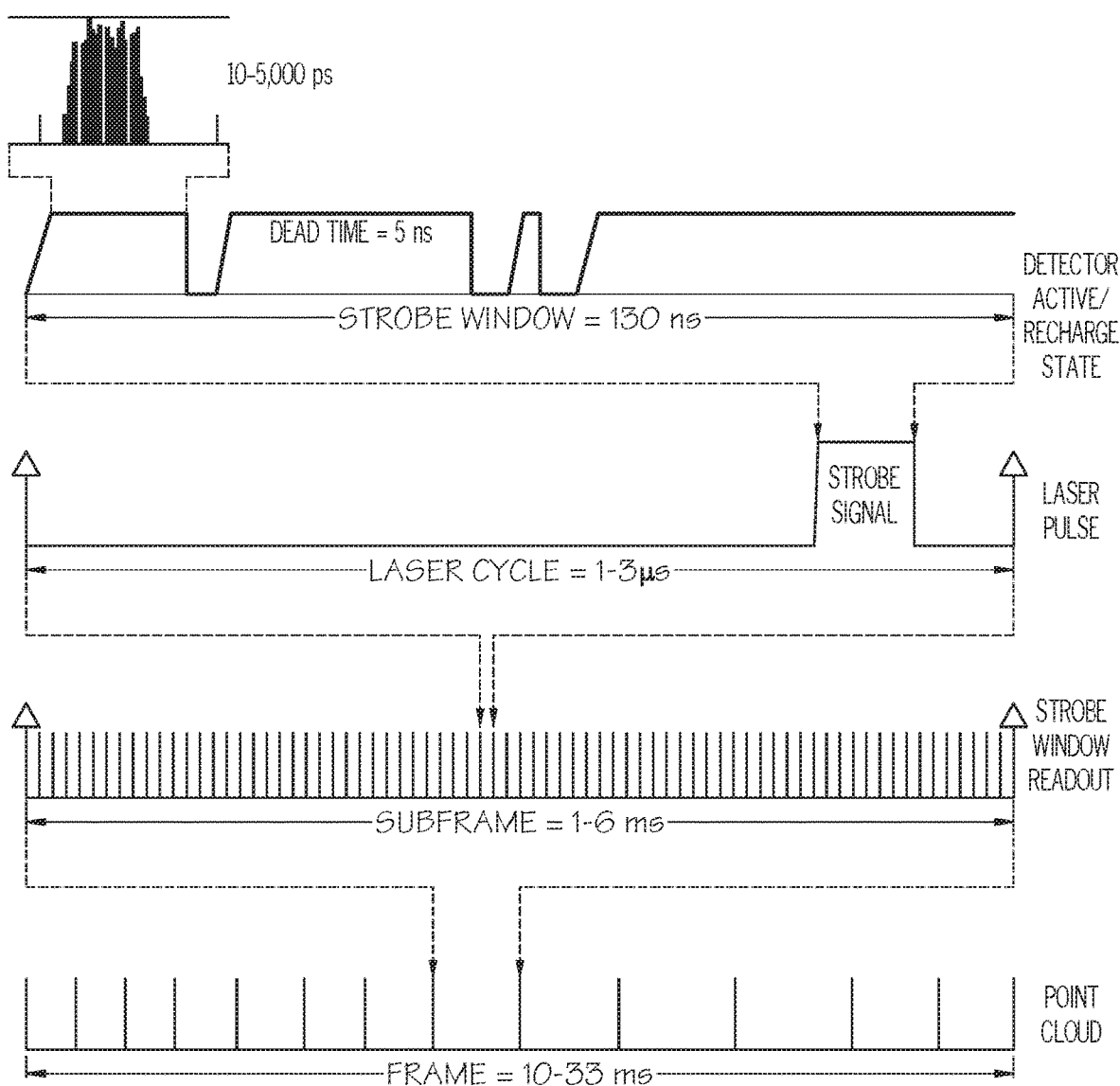
FIGS. 4A and 4B are diagrams illustrating relationships between image frames, subframes, laser cycles, and time gates that may be used in lidar systems in accordance with some embodiments of the present invention.
Figure 4B:
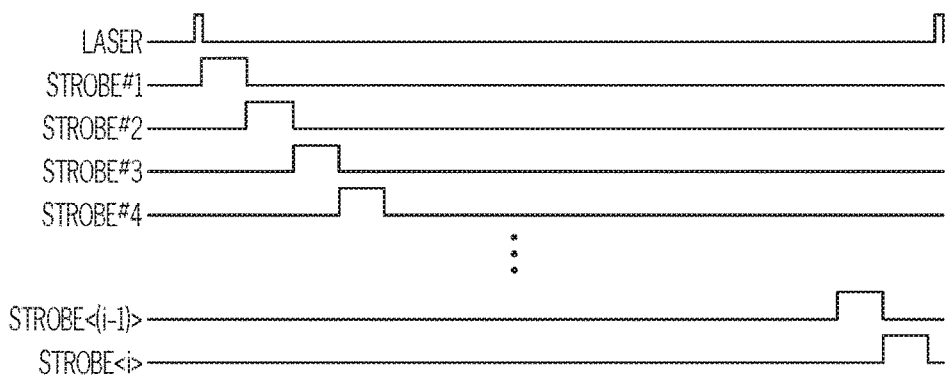

FIG. 4A is a diagram illustrating relationships between image frames, subframes, laser cycles, and time gates (also referred to herein as strobe windows) as utilized in some lidar systems. FIG. 4B is a diagram illustrating the division of the time period between laser pulses into i strobe windows, with each strobe window 1 to i defining a duration of activation for a detector (e.g., a SPAD) at a respective delay that differs with respect to the laser pulse, responsive to respective strobe signals Strobe#1 to Strobe<i>. In some embodiments, each strobe window 1 to i may be identical in duration. As noted above, many repetitions of each strobe window (e.g., with each strobe window repeated for hundreds or thousands of laser pulses) may be captured for each subframe of an image frame.

As shown in FIGS. 4A and 4B, a strobe window having a particular duration may be activated during an example laser cycle having a particular time duration between emitted laser pulses. For example, at an operating frequency of 750 kHz, a laser cycle may be about 1.3 μs. Different time durations within individual laser cycles (e.g., respective timeslots or time slices between laser pulses) may be associated with respective strobe windows. For example, the time duration of the laser cycle may be divided into a plurality of potential strobe window durations, such as, for example, 10 strobe windows of 130 ns each. Respective strobe signals (e.g., output from or under control of the processors 105, 105', 205) may define the timing and activation of the detectors 110d for the respective strobe windows.

A first one of these strobe windows may be active (in response to a first strobe signal) during a first set of the laser cycles (e.g., 1000 laser cycles), while a second one of the strobe windows may be active (in response to a second strobe signal) during a second set of the laser cycles. The strobe windows can be mutually exclusive or overlapping in time over the respective laser cycles, and can be ordered monotonically or not monotonically. An image subframe may include multiple laser pulses with an associated laser cycle, with a strobe window active in each of the laser cycles. For example, there may be about 1000 laser cycles in each subframe. Each subframe may also represent data collected for a respective strobe window. A strobe window readout operation may be performed at the end of each subframe (e.g., by readout circuit 209) with multiple subframes (each corresponding to a respective strobe window) making up each image frame (for example, 20 subframes in each frame). The timings shown in FIGS. 4A and 4B are by way of example only, and other timings may be possible in accordance with embodiments described herein.

Figure 5:
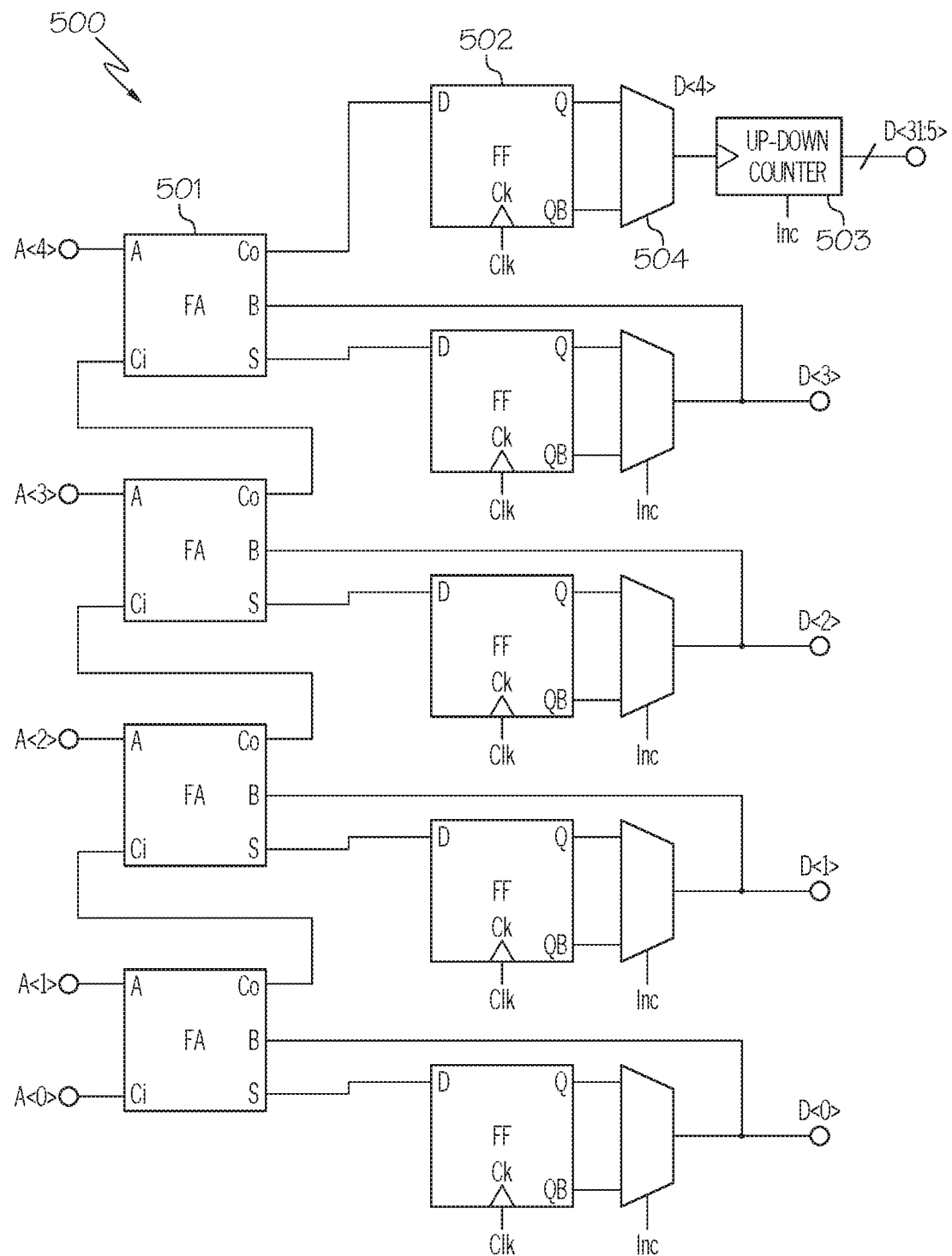
FIG. 5 illustrates an example accumulator/integrator circuit in accordance with some embodiments of the present invention.

FIG. 5 illustrates an example accumulator/integrator circuit 500 in accordance with some embodiments of the present invention. For example, the accumulator/integrator circuit 500 may be used to implement the accumulators 201 and/or 201 as described herein. As shown in FIG. 5, the circuit 500 may be implemented as an increment/decrement accumulator, including a plurality of full adders FA 501, D flip-flops 502, multiplexers 504, and an up-down counter 503. The D flip-flops 502 are responsive to the respective sums S of the inputs (illustrated by way of example as A<0:4>) to the full adders FA 501 and a clock signal Clk to provide outputs (illustrated by way of example as D<31:0>). The full adders FA 501 are implemented in a carry chain, whereby the carry output (Co) of one full adder FA 501 is connected to the carry input (Ci) of the next full adder FA 501. The carry output of the final full adder FA 501 in the chain is connected to the up-down counter 503. The implementation shown in FIG. 5 will be understood to those of skill in the art and is provided by way of example only, so further description is omitted.

Figure 6:
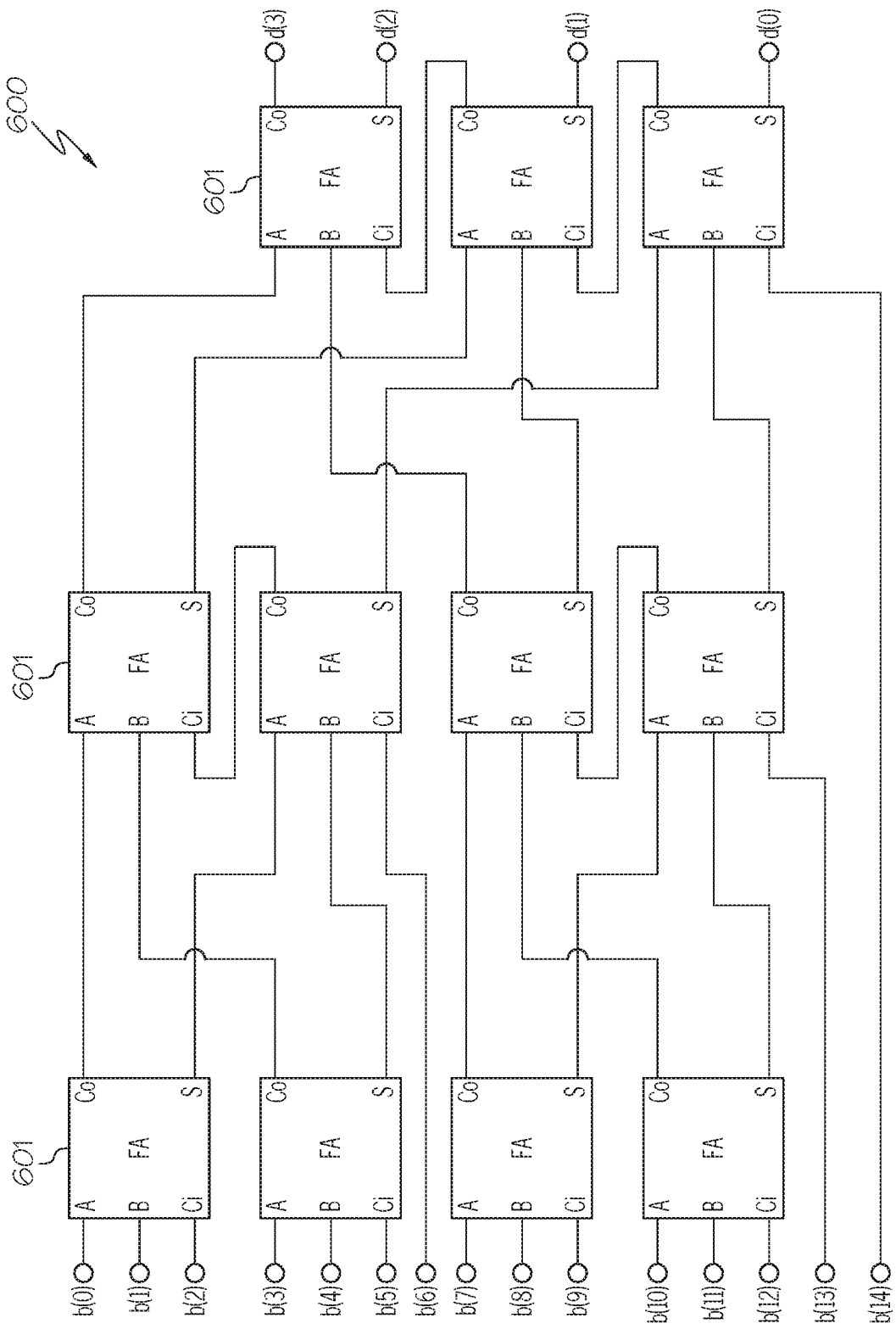
FIG. 6 illustrates an example parallel counter/summer circuit in accordance with some embodiments of the present invention.

FIG. 6 illustrates an example parallel counter/summer circuit 600 that may be used in some embodiments of the present invention. For example, the parallel counter/summer circuit 600 may be used to implement the parallel counter 204 as described herein. As shown in FIG. 6, the circuit 600 may be implemented using a plurality of full adders FA 601 that are connected to provide outputs d<3:0> responsive to inputs b<14:0>. The implementation shown in FIG. 6 will be understood to those of skill in the art and is provided by way of example only, so further description is omitted.

Figure 7:
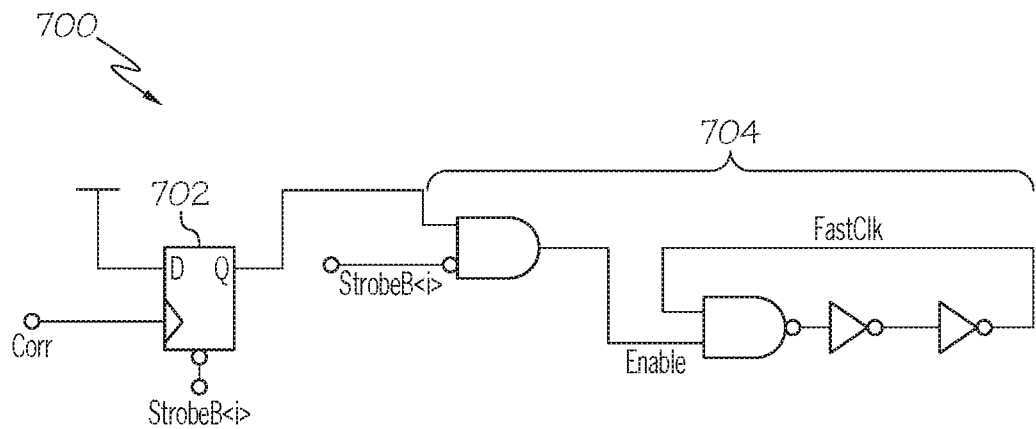
FIG. 7 illustrates an example gated ring oscillator (GRO) in accordance with some embodiments of the present invention.

FIG. 7 illustrates an example of a gated ring oscillator (GRO) circuit 700 in accordance with some embodiments of the present invention. In some embodiments, the GRO circuit 700 may be used to implement the gated clock 207 of FIG. 2. As shown in FIG. 7, the GRO 700 may be implemented using a D flip-flop 702 and combinations of logic elements 704 to generate the clock signal FastClk in to the output Corr from the correlator 203 and a signal StrobeB<i>, which (as shown in FIG. 3) is the inverse of the strobe signal Strobe<i>. The frequency of the clock signal FastClk can be relatively low (e.g., 1-5 GHz for CMOS nodes). This lower frequency may allow power consumption to be reduced or minimized by using long transistors to slow the native frequency of the oscillator. A GRO 700 may typically have a strong PVT sensitivity, accumulating jitter with time and mismatch (e.g., about 1-2%).

In some embodiments, a global free running clock source (e.g., with a clock frequency of a few hundred MHz) may be gated into the pixel accumulators by the Enable signal. Some circuits may couple oscillators across an array to generate such a global free running clock source, which can reduce sensitivity, jitter, and mismatch over some GRO-based approaches. Disadvantages of such circuits may include consuming power independent of signal level, as the oscillators may be left running continuously rather than as a function of SPAD activity.

While FIGS. 5-7 illustrate example circuits that may be used to implement components of a CMM pixel processor as described herein, it will be understood that the circuits described and illustrated herein are provided by way of example only, and that embodiments of accumulators, parallel counters, and/or other circuits described herein are in no way limited to these example implementations.

Embodiments of the present invention including circuits that implement signal processing operations for CMM-based direct ToF calculations as described herein may allow for significantly and/or drastically reduced counting and/or storage requirements, for example, in terms of bit depths (photon counting depths) of the accumulators that may be used.

Some examples described herein illustrate bit depths or number of bits of the accumulators with reference to an 80 ns strobe window (16 strobes), with up to 16 correlated events per strobe window (equivalent to 200 MHz of photon arrivals on detector or microcells), and a longest sub-frame of 20 ms equivalent to 15384 laser pulses. For a 200 ps clock (400 clocks in strobe; rounded in this example to 512), a maximum number of correlated photons may be 246,000. As such, a time accumulator may require 126 million counts. In some embodiments described herein, a photon counter 202 of 18 bits and a time accumulator 201 of 27 bits may be used, with a maximum total output of 45 bits (or minimum total output of 37 bits). In this example, implementation may include a total of 45 DFF (D flip-flops) in accumulators, 4DFF counters, 19 FA (full adders) in parallel counter/accumulators, 16 active quenches, a 3-stage GRO, and injection locking. Compared to some conventional a 4×4 SPAD pixels (e.g., as described in "A 256×256 40 nm/90 nm CMOS 3D-Stacked 120 dB-Dynamic-Range Reconfigurable Time-Resolved SPAD Imager," to Henderson et al., 2019 International Solid-State Circuits Conference, San Francisco, USA), pixels described herein may be reduced to about 20-24 µm pitch and use about 5-6 µm pitch SPADs, thereby allowing for fewer bits and lower power with reduced Fastclk frequency.

Figure 8:
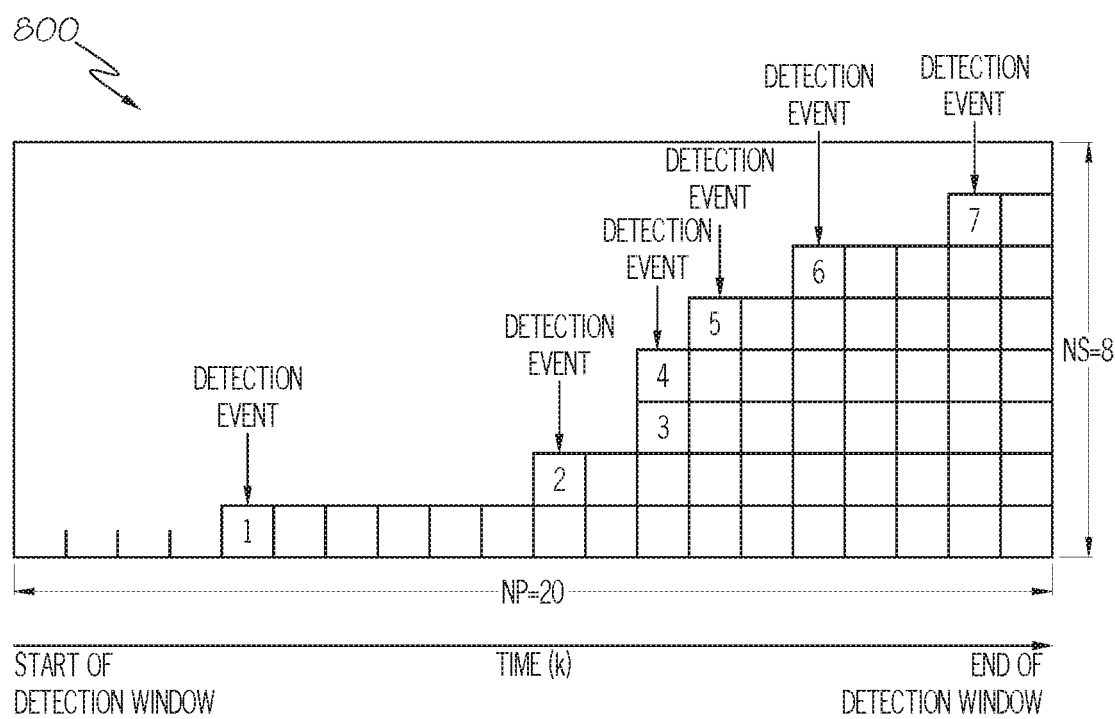
FIG. 8 illustrates an example of operations performed by CMM pixel processors in accordance with some embodiments of the present invention.

Further examples illustrating advantages provided by center of mass calculation techniques in accordance with embodiments of the present invention (as compared to some conventional timestamp summation and averaging techniques that require time-to-digital conversion operations) are described with reference to FIG. 8. FIG. 8 illustrates a histogram 800 of detection events (shown by arrows ↓) over a detection window according to embodiments of the present invention. In some embodiments, the detection window (including the timesteps k) may be one of a plurality of strobe windows between laser pulses of a LIDAR emitter, where the strobe windows correspond to respective distance subranges of the imaging distance range defined by the duration of time between laser pulses of the emitter. In some embodiments, the detection window (including the timesteps k) may represent the entire duration of time between pulses of the emitter. In these examples, center of mass CM may be calculated using the following equation, $$CM = \frac{\sum_{f=0}^{NC}\sum_{e=0}^{NS} T(e, f)}{\sum_{f=0}^{NC} NS(f)}$$

where NC refers to the number of laser cycles (e.g., the total number of laser cycles allocated to a particular strobe window and associated distance sub-range), NS is the number of SPADs (e.g., the total number of SPADs in the detector array), and T(e,f) is the time offset of a SPAD detection event or trigger e, relative to the time of a laser pulse in cycle f (of the number of laser cycles NC). If a SPAD does not trigger, then T(e,f)=0.

The numerator of the CM expression above can be rewritten as (for cycle f), $$\sum_{e=0}^{NS} T(e) = NP - \sum_{k=0}^{NP} NS(k)$$

where NS(k) is number of SPADs which have been triggered at timestep k in the laser period or cycle (or portion thereof represented by a particular strobe window), and NP is the maximum number of timesteps in a laser period or strobe window. The left-hand side of this equation requires multiple individual timestamps to be summed. In contrast, the right-hand side of the above equation, in accordance with embodiments described herein, can be calculated as a rolling sum (e.g., at each consecutive timestep k) of the number of triggered SPADs NS(k), which may be determined without the use of a respective TDC operation for each SPAD.

As shown in the example of FIG. 8, the total number of timing intervals k (i.e., in each strobe window or in each laser cycle if there is only one strobe window per laser cycle) in the laser period NP=20, and the number of SPADs in the array NS=8 of which 7 are triggered (or "fired") responsive to incident photons. As shown above, in this example, SPAD 1 is fired at timestep k=4, SPAD 2 is fired at timestep k=10, SPAD 3 and 4 are fired at timestep k=12, SPAD 5 is fired at timestep k=13, SPAD 6 is fired at timestep k=15, and SPAD 7 is fired at timestep k=18.

Using some timestamp averaging techniques that require time-to-digital conversion operations, the center of mass can be calculated as an average sum of timestamps (that is, by averaging a sum of the respective times of triggering of each of the 7 SPADs) as:

CM=(4+10+12+12+13+15+18)/7=12

However, this example timestamp averaging may require 7 separate time-to-digital conversion operations (e.g., by 7 time multiplexed TDCs or a multi-event TDC). Such operations are described, for example, in "A CMOS SPAD sensor with a multievent folded flash time-to-digital converter for ultra-fast optical transient capture," to Henderson et al., IEEE Sensors J., vol. 18, no. 8, pp. 3163-3173, April 2018. Each of such time-to-digital conversion operations can consume considerable power and/or device area, which may prohibit implementation in a small pixel. Moreover, the coincident arrival of two photons in two SPADs (shown for example at timestep k=12 for SPAD 3 and SPAD 4 above) may not be converted correctly in many schemes, resulting in only one time stamp to be issued. This can represent pile-up distortion and can (inaccurately) weight the estimated average time of arrival to earlier times.

In contrast, rolling calculation of center of mass in accordance with embodiments of the present invention may be based on the sum of the number of fired SPADs NS(k) (indicating the number of detection events that have occurred) at each timestep k, that is, by averaging a sum of the number of SPADs that have been triggered at or as of each timing interval k. As shown below, such rolling calculation of the center of mass provides the same result as the conventional timestamp averaging, but without the computational complexity and power requirements of additional time-to-digital conversion operations:

$$CM = 20 - (1+1+1+1+1+1+2+2+4+5+5+6+6+7+7)/7 = 12$$

Rolling center of mass can be calculated by a cascade of a parallel summer or counter and an accumulator, as shown by way of example in the SPAD pixel processor 205 of FIG. 2. The counted number of correlations can be integrated in a rolling fashion by a high speed clock 207 (e.g., having a period of a few 100 ps), for example, 200-500 ps or even up to 1 ns (depending on the target distance range), and can be repeated over many laser cycles. Counted correlations in rolling center of mass calculation in accordance with embodiments of the present invention may thus be much coarser than some conventional TDC bins (e.g., 20-100 ps).

Some embodiments described herein may be suitable for relatively short gated time intervals, where there may be a relatively low probability of multiple firings of the same SPAD. In other embodiments, the parallel counter 204 can handle coincident firings of multiple SPADs (i.e., where two or more SPADs are triggered substantially simultaneously), such as can occur in intense laser return scenarios (e.g., for targets at short range), thus avoiding skew of the center of mass (CM) by pile-up. That is, multiple SPADs may be triggered in the strobe window, and SPADs may be fired multiple times in the same strobe window (i.e., the SPADs are not limited to firing once per window), as shown in the example timing diagram of FIG. 3.

As such, embodiments of the present invention can process multiple correlation photon events in a strobe window. In embodiments where the photon flux per pixel is high enough such that SPADs are expected to trigger multiple times per strobe window, the front-end circuit can include an active quench, active recharge circuit (e.g., circuit 206 shown in FIG. 2) with a hold off time equal to the correlation time or window (or alternatively, a passive quench circuit followed by a monostable circuit). In embodiments where the photon flux is low enough (or the strobe window is short enough) such that each SPAD is unlikely to fire more than once per strobe window, a less complex circuit (e.g., an arm-once MOS) can be used to pull the SPAD above breakdown at the beginning of the laser cycle.

In some embodiments, the accumulator(s) (e.g., the accumulator circuits 201 and 202 of FIG. 2) may operate responsive to the output of the correlator circuit (i.e., only when correlated photons are detected, for example responsive to outputs of the correlator 203 of FIG. 2), such that only groups of photons arriving within a pre-determined time are used for calculating the estimated times of arrival. The correlator output signal may serve as a control for the accumulator(s), allowing detection event measurements in response to correlated photon detection and otherwise preventing such detection event measurements from occurring, which may reduce counting requirements and power consumption.

In some embodiments, the accumulator (e.g., the time accumulator 201 of FIG. 2) may operate responsive to a gated clock signal, e.g., as output from the gated clock 207 of FIG. 2. For example, in some embodiments, the clock signal may be gated to control the accumulator stage (main load on high speed clock) as NS(k)>thresh (e.g., thresh=1, 2,4,8), where NS(k) is the number of SPADs that have been triggered at each timestep k, to avoid excess power consumption. The threshold (thresh) may be a variable threshold that can be varied (e.g., by the control circuit 105 of FIG. 1A) according to a distance range offset of or corresponding to a respective time gate period and/or detection of ambient light level. Selection of thresh=1 for the variable threshold feeds uncorrelated single photon events into the center of mass circuitry with unattenuated background signal due to dark count or ambient illumination. Selection of higher values for the variable threshold (e.g., thresh-=2, 4, 8) to increase the threshold number of photons that must arrive within the correlation window to qualify as a detection event can progressively suppress background signal levels, while favoring correlated laser pulse returns provided there is a peak laser power that exceeds the background power. Such thresholds are described with reference to but are not limited to binary numbers, which can provide a less complex correlator implementation, e.g., by just multiplexing a single bit of the C<4:0> signal or word as the Corr signal in FIG. 2. For other more general cases of NS(k)>thresh, a decoder or digital comparator can be used (with potentially greater hardware area implications).

Embodiments of the present disclosure have been described herein with reference to light-based ranging measurement systems (such as lidar) and related methods of operation that are configured to reduce the quantity of incoming photons that are measured and/or stored as data in memory. In particular, photons are selectively captured or counted based on a time correlation between their respective times of arrival, which can reduce the quantity of incoming photons that are measured and processed. For example, based on recognition that photons from a pulsed laser and reflected by a target may arrive in a relatively narrow window of time, embodiments described herein can thereby selectively capture or count these correlated photons while rejecting uncorrelated photons from ambient light sources (e.g., the sun), to provide in-pixel averaging without time-to-digital conversion by implementing the rolling center of mass calculation techniques as described herein. That is, processing circuits as described herein may perform calculation of the times-of-arrival (TOAs) of signal photons received in a same correlation window defined by the correlator circuit. The processing circuit may be configured to calculate an estimated time of arrival of the burst of photons based on a ratio of the time-integrated number of detection events (e.g., as provided by time accumulator circuits herein) and the count of the detection events (e.g., as provided by photon counter circuits herein) of the photons by respective SPADs in the array.

Lidar systems and arrays described herein may be applied to ADAS (Advanced Driver Assistance Systems), autonomous vehicles, UAVs (unmanned aerial vehicles), industrial automation, robotics, biometrics, modeling, augmented and virtual reality, 3D mapping, and security. In some embodiments, the emitter elements of the emitter array may be vertical cavity surface emitting lasers (VCSELs). In some embodiments, the emitter array may include a non-native substrate having thousands of discrete emitter elements electrically connected in series and/or parallel thereon, with the driver circuit implemented by driver transistors integrated on the non-native substrate adjacent respective rows and/or columns of the emitter array, as described for example in U.S. Patent Application Publication No. 2018/0301872 to Burroughs et al., filed Apr. 12, 2018, with the United States Patent and Trademark Office, the disclosure of which is incorporated by reference herein.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

The example embodiments are mainly described in terms of particular methods and devices provided in particular implementations. However, the methods and devices may operate effectively in other implementations. Phrases such as "example embodiment", "one embodiment" and "another embodiment" may refer to the same or different embodiments as well as to multiple embodiments. The embodiments will be described with respect to systems and/or devices having certain components. However, the systems and/or devices may include fewer or additional components than those shown, and variations in the arrangement and type of the components may be made without departing from the scope of the inventive concepts. The example embodiments will also be described in the context of particular methods having certain steps or operations. However, the methods and devices may operate effectively for other methods having different and/or additional steps/operations and steps/operations in different orders that are not inconsistent with the example embodiments. Thus, the present inventive concepts are not intended to be limited to the embodiments shown, but are to be accorded the widest scope consistent with the principles and features described herein.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the disclosure and, although specific terms are employed, they are used in a generic and descriptive sense only and not for purposes of limitation.

The invention claimed is:

1. A Light Detection And Ranging (LIDAR) measurement circuit, comprising:
at least one processor circuit configured to perform operations comprising:
receiving detection signals output from a plurality of detector elements in response to a plurality of photons incident thereon during a detection window;
identifying detection events based on the detection signals; and
calculating an estimated time of arrival of the plurality of photons based on a sum of respective numbers of the detection events that have been identified at respective time intervals of the detection window.

2. The LIDAR measurement circuit of claim 1, wherein the at least one processor circuit comprises:
an accumulator circuit that is configured to output the sum of the respective numbers of the detection events that have been identified at the respective time intervals based on a counter signal that is incremented responsive to each of the detection events, and a clock signal corresponding to the respective time intervals.

3. The LIDAR measurement circuit of claim 2, wherein the accumulator circuit is a first accumulator circuit, and wherein the at least one processor circuit further comprises:
a second accumulator circuit that is configured to output a count value indicating a total number of the detection events that have been identified during the detection window, based on the counter signal.

4. The LIDAR measurement circuit of claim 2, wherein the at least one processor circuit further comprises:
a correlation circuit that is configured to perform the identifying of the detection events based on respective subsets of the detection signals output within respective correlation times relative to one another, and is configured to increment the counter signal responsive to the identifying of each of the detection events.

5. The LIDAR measurement circuit of claim 4, wherein the at least one processor circuit further comprises:
a parallel counter circuit that is configured to output a signal indicating a number of the detection signals of each of the respective subsets,
wherein the correlation circuit is configured to perform the identifying of the detection events based on the number of the detection signals of each of the respective subsets relative to a threshold number.

6. The LIDAR measurement circuit of claim 2, wherein the accumulator circuit is configured to integrate respective values of the counter signal responsive to respective pulses of the clock signal, wherein a period of the respective pulses of the clock signal corresponds to the respective time intervals.

7. The LIDAR measurement circuit of claim 2, wherein the at least one processor circuit further comprises:
a clock circuit that is configured to output the clock signal to the accumulator circuit responsive to a strobe signal corresponding to the detection window and one of the detection events indicated by the identifying, and independent of a start of the detection window.

8. The LIDAR measurement circuit of claim 1, wherein the at least one processor circuit is configured to calculate the estimated time of arrival of the plurality of photons based on a ratio of the sum of the respective numbers of the detection events that have been identified at the respective time intervals of the detection window and a count value indicating a total number of the detection events that have been identified during the detection window.

9. The LIDAR measurement circuit of claim 1, wherein the detection window comprises a first detection window, and wherein the operations further comprise:
receiving second detection signals output from one or more of the plurality of detector elements responsive to second photons incident thereon during a second detection window,
wherein the at least one processor circuit is configured to perform background correction of the estimated time of arrival based on the second detection signals.

10. The LIDAR measurement circuit of claim 1, wherein the detection signals indicate respective times of arrival of the photons during the detection window, and wherein the at least one processor circuit is configured to calculate the estimated time of arrival of the plurality of photons independent of time to digital conversions of the respective times of arrival.

11. A Light Detection And Ranging (LIDAR) system, comprising:
a detector array comprising single-photon detector elements configured to output detection signals in response to a plurality of photons incident thereon during a detection window; and
at least one processor circuit configured to receive the detection signals output from the detector array, identify detection events based on the detection signals, and calculate an estimated time of arrival of the plurality of photons based on a sum of respective numbers of the detection events that have been identified at respective time intervals of the detection window.

12. The LIDAR system of claim 11, wherein the at least one processor circuit comprises:
a first accumulator circuit that is configured to output the sum of the respective numbers of the detection events that have been identified at the respective time intervals by integrating respective values of a counter signal that is incremented responsive to each of the detection events, responsive to respective pulses of a clock signal corresponding to the respective time intervals; and
a second accumulator circuit that is configured to output a count value indicating a total number of the detection events that have been identified during the detection window, based on one of the respective values of the counter signal,
wherein the at least one processor circuit is configured to calculate the estimated time of arrival of the plurality of photons based on a ratio of the sum and the count value.

13. The LIDAR system of claim 12, wherein the at least one processor circuit further comprises:
a correlation circuit that is configured to identify the detection events based on respective subsets of the detection signals output within respective correlation times relative to one another, and is configured to increment the counter signal responsive to each of the detection events; and a clock circuit that is configured to output the clock signal responsive to one of the detection events identified by the correlation circuit and a strobe signal corresponding to the detection window.

14. The LIDAR system of claim 13, wherein the at least one processor circuit further comprises:
a parallel counter circuit that is configured to output a signal indicating a number of the detection signals of each of the respective subsets,
wherein the correlation circuit is configured to identify the detection events based on the number of the detection signals of each of the respective subsets relative to a threshold number.

15. The LIDAR system of claim 11, wherein the detection signals indicate respective times of arrival of the photons during the detection window, and wherein the at least one processor circuit is configured to calculate the estimated time of arrival of the plurality of photons independent of time to digital conversions of the respective times of arrival.

16. A Light Detection And Ranging (LIDAR) measurement circuit, comprising:
at least one processor circuit that is configured to receive detection signals output from single-photon detector elements indicating respective times of arrival of photons incident thereon during a detection window, the at least one processor circuit comprising:
one or more accumulator circuits that are configured to sum respective numbers of detection events that have been identified at respective time intervals of the detection window based on the detection signals to calculate an estimated time of arrival of the photons independent of time to digital conversions of the respective times of arrival.

17. The LIDAR measurement circuit of claim 16, wherein the one or more accumulator circuits comprise:
a first accumulator circuit that is configured to output the sum by integrating respective values of a counter signal that is incremented responsive to each of the detection events, responsive to respective pulses of a clock signal corresponding to the respective time intervals.

18. The LIDAR measurement circuit of claim 17, wherein the one or more accumulator circuits further comprise:
a second accumulator circuit that is configured to output a count value indicating a total number of the detection events that have been identified during the detection window, based on one of the respective values of the counter signal,
wherein the at least one processor circuit is configured to calculate the estimated time of arrival of the plurality of photons based on a ratio of the sum and the count value.

19. The LIDAR measurement circuit of claim 17, wherein the at least one processor circuit further comprises:
a correlation circuit that is configured to identify the detection events based on respective subsets of the detection signals output within respective correlation times relative to one another, and is configured to increment the counter signal responsive to each of the detection events; and
a clock circuit that is configured to output the clock signal responsive to one of the detection events identified by the correlation circuit and a strobe signal corresponding to the detection window.

20. The LIDAR measurement circuit of claim 19, wherein the at least one processor circuit further comprises:
a parallel counter circuit that is configured to output a signal indicating a number of the detection signals of each of the respective subsets, wherein the correlation circuit is configured to identify the detection events based on the number of the detection signals of each of the respective subsets relative to a threshold number.

* * * * *